United States Patent
Doi et al.

(10) Patent No.: US 7,641,760 B2
(45) Date of Patent: Jan. 5, 2010

(54) METHOD OF THERMAL ADHEREND RELEASE AND APPARATUS FOR THERMAL ADHEREND RELEASE

(75) Inventors: Tomoko Doi, Ibaraki (JP); Daisuke Shimokawa, Ibaraki (JP); Yukio Arimitsu, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 577 days.

(21) Appl. No.: 11/296,323

(22) Filed: Dec. 8, 2005

(65) Prior Publication Data

US 2006/0124241 A1    Jun. 15, 2006

(30) Foreign Application Priority Data

Dec. 9, 2004    (JP)    ............... P. 2004-356463

(51) Int. Cl.
    *B32B 38/10*    (2006.01)
(52) U.S. Cl. .................. 156/344; 156/584; 438/464; 438/976
(58) Field of Classification Search ............... 156/344, 156/584; 438/464, 976
    See application file for complete search history.

(56) References Cited

U.S. PATENT DOCUMENTS 6,500,733 B1 * 12/2002 Stanbery ................. 438/459
2002/0195199 A1 * 12/2002 Izutani et al. ............ 156/344

FOREIGN PATENT DOCUMENTS

JP          11-3875 A      1/1999
JP       2002-322436 A    11/2002

* cited by examiner

*Primary Examiner*—Mark A Osele
(74) *Attorney, Agent, or Firm*—Sughrue Mion, PLLC

(57) ABSTRACT

A method of thermal adherend release, wherein a part of adherends adherent to a heat-peelable pressure-sensitive adhesive sheet having a heat-expandable layer containing a foaming agent are selectively released from the pressure-sensitive adhesive sheet by partly heating the heat-peelable pressure-sensitive adhesive sheet, wherein the method comprises previously heating a sticking site of an adherend to be released at a temperature at which the heat-expandable layer of the heat-peelable pressure-sensitive adhesive sheet does not expand and then heating the sticking site of the adherend in the heat-peelable pressure-sensitive adhesive sheet at a temperature at which the heat-expandable layer expands to thereby selectively releasing the adherend.

11 Claims, 1 Drawing Sheet

METHOD OF THERMAL ADHEREND RELEASE AND APPARATUS FOR THERMAL ADHEREND RELEASE

FIELD OF THE INVENTION

The present invention relates to a method for selectively releasing a part of an adherend from a heat-peelable pressure-sensitive adhesive sheet provided with a heat-expandable layer by heating and to an apparatus for thermal adherend release to be used by the subject method.

BACKGROUND ART

As a method for releasing the parts as stuck to a pressure-sensitive adhesive tape from the pressure-sensitive adhesive tape after processing, for example, there is a method for picking up a semiconductor chip as prepared by shrinking a base material and dicing it (see Patent Document 1). However, only by this method for shrinking a base material, it is difficult to reduce an adhesive strength between the diced semiconductor chip and the base material to an extent that the semiconductor chip can be easily picked up. Also, in shrinking, it is difficult to uniformly shrink the base material in the machine direction and the transverse direction. Thus, there was a problem that the semiconductor chip causes displacement and comes into contact with an adjacent semiconductor chip, resulting in breakage of the semiconductor chip.

On the other hand, heat-peelable pressure-sensitive adhesive sheets provided with a heat-expandable layer containing a foaming agent such as a heat-expandable microsphere (for example, trade names "RIVALPHA" and "RIVACLEAN", all of which are manufactured by Nitto Denko Corporation) are used in various applications in a variety of fields. According to such a heat-peelable pressure-sensitive adhesive sheet, not only it is possible to stick and fix an adherend, thereby subjecting the adherend to desired processing, but also after processing, by expanding the foaming agent such as a heat-expandable microsphere in the heat-expandable layer by heating, thereby lowering or vanishing an adhesive strength by the heat-peelable pressure-sensitive adhesive sheet, it is possible to easily release the adherend as stuck to the heat-peelable pressure-sensitive adhesive sheet.

In such a heat-peelable pressure-sensitive adhesive sheet, in releasing the adherend from the heat-peelable pressure-sensitive adhesive sheet, a heating treatment is usually applied to the entire surface onto which the adherend sticks, thereby releasing the whole of the adherend at once. However, recently, in performing thermal release, a requirement for releasing only a part of an adherend of plural adherends as stuck to a heat-peelable pressure-sensitive adhesive sheet, while keeping the remainder in the state that it sticks to the heat-peelable pressure-sensitive adhesive sheet, is increasing.

Concretely, for example, in a processing step of the FPC (flexible printed circuit) parts having a thin-layer copper foil and a polyimide film laminated therein, a step in which after sticking and fixing the parts to a heat-peelable pressure-sensitive adhesive sheet and applying cutting processing, the subject heat-peelable pressure-sensitive adhesive sheet is thermally treated to transfer and separate a cut piece of a part of the parts is included. At this time, deformation or falling off of other cut pieces was found to occur due to vibration as generated at the time of transferring and separating the cut piece of a part of the parts. Furthermore, in a dicing step of a semiconductor wafer or a laminated capacitor, after the dicing processing, in heating the heat-peelable pressure-sensitive adhesive sheet holding the parts to release the parts, there were involved such problems that the whole of the parts including the parts which one intends to hold is separated and that displacement or falling off of the parts occurs due to vibration as generated at the time of transferring and separating the parts after processing.

Then, the present inventors proposed a thermal release method of an adherend in which in releasing an adherend from a heat-peelable pressure-sensitive adhesive sheet provided with a heat-expandable layer by heating, only a desired part of an adherend of plural adherends can be simply released, while the remainder can be kept in the state that it sticks to the heat-peelable pressure-sensitive adhesive sheet (see Patent Document 2).

[Patent Document 1]
 JP-A-11-3875

[Patent Document 2]
 JP-A-2002-322436

SUMMARY OF THE INVENTION

However, in recent years, rather than productivity, a method in which a part of an adherend of plural adherends as stuck to a heat-peelable pressure-sensitive adhesive sheet can be selectively released more rapidly from the heat-peelable pressure-sensitive adhesive sheet is demanded.

Accordingly, an object of the invention is to provide a thermal release method of an adherend in which in releasing an adherend from a heat-peelable pressure-sensitive adhesive sheet, only a desired part of an adherend of plural adherends can be released simply and more rapidly, while the remainder can be kept in the state that it sticks to the heat-peelable pressure-sensitive adhesive sheet and an apparatus for thermal adherend release.

Another object of the invention is to provide a thermal release method of an adherend in which at the time of processing of an adherend, the adherend can be held without causing falling off from a heat-peelable pressure-sensitive adhesive sheet, and after processing, a desired part of an adherend of plural adherends can be separated easily and more rapidly from the heat-peelable pressure-sensitive adhesive sheet without causing damaging or displacement of the adherend and an apparatus for thermal adherend release.

In order to achieve the foregoing objects, the present inventors made extensive and intensive investigations. As a result, it has been found that in selectively releasing a part of an adherend of plural adherends as stuck to a heat-peelable pressure-sensitive adhesive sheet by heating by a heating measure for partially heating the heat-peelable pressure-sensitive adhesive sheet, when a sticking site of a prescribed adherend is previously heated, only a desired part of an adherend can be released simply and more rapidly. The invention has been accomplished based on such a finding.

Specifically, the invention is to provide a thermal release method of an adherend for selectively releasing a part of an adherend of plural adherends as stuck to a heat-peelable pressure-sensitive adhesive sheet provided with a heat-expandable layer containing a foaming agent by partially heating the heat-peelable pressure-sensitive adhesive sheet, which comprises previously heating a sticking site of an adherend to be released at a temperature at which the heat-expandable layer of the heat-peelable pressure-sensitive adhesive sheet does not expand and then heating the sticking site of the adherend in the heat-peelable pressure-sensitive adhesive sheet at a temperature at which the heat-expandable layer expands, thereby selectively releasing the adherend.

In the thermal release method of an adherend of the invention, it is preferable that the temperature at which the sticking site of the adherend to be released is previously heated is 30° C. lower than the release start temperature of the heat-peelable pressure-sensitive adhesive sheet or higher but lower than the release start temperature of the heat-peelable pressure-sensitive adhesive sheet. As the foregoing foaming agent, a heat-expandable microsphere can be suitably used.

In the foregoing thermal release method of an adherend, the sticking site of the adherend to be released in the heat-peelable pressure-sensitive adhesive sheet can be previously heated at a temperature at which the thermo-expandable layer of the heat-peelable pressure-sensitive adhesive sheet does not expand by a heating measure capable of not only partially heating the heat-peelable pressure-sensitive adhesive sheet but also heating it corresponding to the shape of the adherend to be released. Also, the sticking site of the adherend to be released in the heat-peelable pressure-sensitive adhesive sheet can be heated at a temperature at which the heat-expandable layer expands by a heating measure capable of not only partially heating the heat-peelable pressure-sensitive adhesive sheet but also heating it corresponding to the shape of the adherend to be released, thereby selectively releasing the adherend.

Also, the sticking site of the adherend to be released can be previously heated from at lease one side of the sticking side of the adherend of the heat-peelable pressure-sensitive adhesive sheet and an opposite side thereto at a temperature at which the heat-expandable layer does not expand. Also, after previously heating the sticking site of the adherend to be released at a temperature at which the heat-expandable layer does not expand, the sticking site of the adherend to be released in the heat-peelable pressure-sensitive adhesive sheet can be heated from at lease one side of the sticking side of the adherend of the heat-peelable pressure-sensitive adhesive sheet and an opposite side thereto at a temperature at which the heat-expandable layer expands.

Furthermore, the invention is to provide a thermal release method of an adherend for selectively releasing a part of an adherend of plural adherends as stuck to a heat-peelable pressure-sensitive adhesive sheet provided with a heat-expandable layer containing a foaming agent, which includes a step for subjecting the adherend as stuck to the heat-peelable pressure-sensitive adhesive sheet to cutting processing into plural cut pieces; a step for previously heating a sticking site of the cut piece to be released of the plural cut pieces at a temperature at which the heat-expandable layer of the heat-peelable pressure-sensitive adhesive sheet does not expand; and a step for heating the sticking site of the cut piece to be released at a temperature at which the heat-expandable layer expands, thereby selectively releasing the cut piece.

Moreover, the invention is to provide an apparatus for thermal adherend release for selectively releasing a part of an adherend of plural adherends as stuck to a heat-peelable pressure-sensitive adhesive sheet provided with a heat-expandable layer containing a foaming agent by partially heating the heat-peelable pressure-sensitive adhesive sheet, which includes a first heating section for previously heating a sticking site of an adherend to be released at a temperature at which the heat-expandable layer of the heat-peelable pressure-sensitive adhesive sheet does not expand; and a second heating section for, after previously heating by the first heating section, heating the sticking site of the adherend in the heat-peelable pressure-sensitive adhesive sheet at a temperature at which the thermo-expandable layer expands, thereby selectively releasing the adherend.

It is preferable that each of the first heating section and the second heating section has a shape such that heating can be performed corresponding to the shape of the adherend to be released. Also, each of the first heating section and the second heating section may be provided in at least one side of the sticking side of the adherend of the heat-peelable pressure-sensitive adhesive sheet and an opposite side thereto. In addition, each of the first heating section and the second heating section may be movable in the horizontal direction and/or the vertical direction.

It is suitable that the thermal release device of an adherend of the invention includes a cutting processing section for subjecting an adherend as stuck to a heat-peelable pressure-sensitive adhesive sheet provided with a heat-expandable layer containing a foaming agent into plural cutting pieces; a first heating section for previously heating the sticking site of a cut piece to be released of the plural cut pieces at a temperature at which the heat-expandable layer of the heat-peelable pressure-sensitive adhesive sheet does not expand; and a second heating section for heating the sticking site of the cut piece to be released at a temperature at which the heat-expandable layer expands, thereby selectively releasing the cut piece.

According to the thermal release method of an adherend of the invention, in releasing an adherend from a heat-peelable pressure-sensitive adhesive sheet, only a desired part of an adherend of plural adherends can be released simply and more rapidly, while the remainder can be kept in the state that it sticks to the heat-peelable pressure-sensitive adhesive sheet. Also, at the time of processing, the adherend can be held without causing falling off from a heat-peelable pressure-sensitive adhesive sheet, and after processing, a desired part of an adherend of plural adherends can be separated easily and more rapidly from the heat-peelable pressure-sensitive adhesive sheet without causing damaging or displacement of the adherend.

In consequence, according to the thermal release device of an adherend of the invention, in a finer and thin-layered adherend, at the time of processing, the adherend can be well held without causing release, and after processing, only a desired part of an adherend of plural adherends can be released with good precision simply and rapidly. Therefore, it is possible to suppress or prevent the generation of inconveniences in the adherend such as damaging and displacement, thereby enabling one to effectively prevent a lowering in productivity or yield, or the like.

The Signs in the drawings are described as follows
1: Heat-peelable pressure-sensitive adhesive sheet
2: Supporting base material
3: Rubber-like organic elastic layer
4: Heat-expandable pressure-sensitive adhesive layer
5: Separator (release liner)
6: Heat release treatment section in thermal release device of adherend
7: First heating section (pre-heating section)
8: Second heating section (release and heating section)
9: Adsorption nozzle
10: Fixing ring 11: Heat-peelable pressure-sensitive adhesive sheet
12: Heat-expandable pressure-sensitive adhesive layer
12a: Un-expanded part where the heat-expandable pressure-sensitive adhesive layer 12 does not expand
12b: Expanded part where the heat-expandable pressure-sensitive adhesive layer 12 expands
13: Base material
14: Adherend
14a: Released adherend

DETAILED DESCRIPTION OF THE INVENTION

Figure 1:
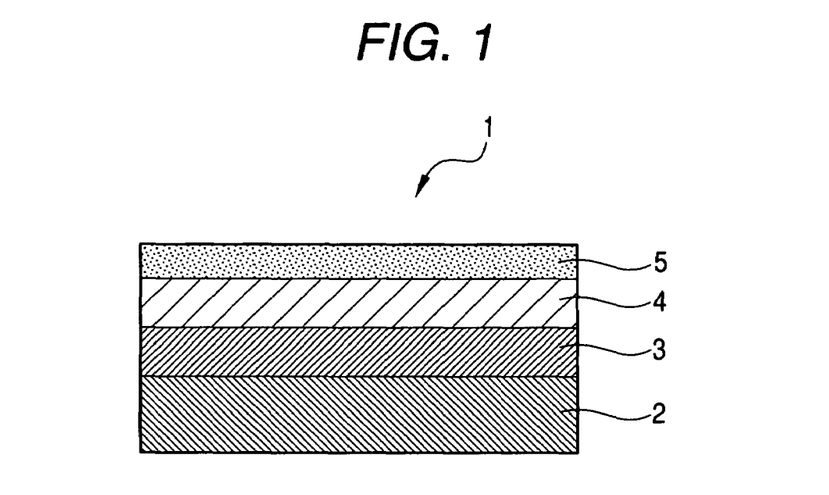
FIG. 1 is an outline cross-sectional view to show one embodiment of a heat-peelable pressure-sensitive adhesive sheet which is used in the thermal release method of an adherend of the invention.

Modes for carrying out the invention will be hereunder described with reference to the drawings as the need arises. FIG. 1 is an outline cross-sectional view to show one embodiment of a heat-peelable pressure-sensitive adhesive sheet which is used in the thermal release method of an adherend of the invention. In FIG. 1, sign 1 stands for a heat-peelable pressure-sensitive adhesive sheet; sign 2 stands for a supporting base material; sign 3 stands for a rubber-like organic elastic layer; sign 4 stands for a heat-expandable pressure-sensitive adhesive layer; and sign 5 stands for a separator (release liner). The heat-peelable pressure-sensitive adhesive sheet 1 as shown in FIG. 1 is constructed such that the heat-expandable pressure-sensitive adhesive layer 4 is formed on one surface of the supporting base material 2 via the rubber-like organic elastic layer 3 and that the separator 5 is further laminated on the heat-expandable pressure-sensitive adhesive layer 4.

(Heat-Peelable Pressure-Sensitive Adhesive Sheet)

The heat-peelable pressure-sensitive adhesive sheet in the invention is at least provided with a heat-expandable layer containing a foaming agent. Such a heat-peelable pressure-sensitive adhesive sheet may have a construction in which a heat-expandable pressure-sensitive adhesive layer is used as a heat-expandable layer and an adhesive layer as shown in FIG. 1, or may have a construction in which a heat-expandable layer and an adhesive layer are used as separate layers. In consequence, the heat-expandable layer containing a foaming agent may also have a function as an adhesive layer. In this way, in the case where the heat-expandable layer is a heat-expandable pressure-sensitive adhesive layer also having a function as an adhesive layer, the heat-peelable pressure-sensitive adhesive sheet is not required to have an adhesive layer, and the surface of the heat-expandable pressure-sensitive adhesive layer can be utilized as the adhesive surface to which an adherend is to be stuck. On the other hand, in the case where the heat-expandable layer does not have a function as an adhesive layer, the heat-peelable pressure-sensitive adhesive sheet is required to have an adhesive layer, and the surface of the subject adhesive layer can be utilized as the adhesive surface to which an adherend is to be stuck. Incidentally, the foregoing adhesive layer can be formed on the thermo-expandable layer.

Incidentally, while the heat-peelable pressure-sensitive adhesive sheet 1 as shown in FIG. 1 has the rubber-like organic elastic layer 3 and the separator 5, these rubber-like organic elastic layer 3 and separator 5 can be arbitrarily used. For example, from the viewpoints of enhancing an anchoring force and revealing a weaving structure in thermally expanding the heat-expandable layer such as a heat-expandable pressure-sensitive adhesive layer, it is preferable that the rubber-like organic elastic layer is used. Furthermore, from the viewpoint of protecting the adhesive surface of the heat-expandable pressure-sensitive adhesive layer, it is preferable that the separator is used. However, the adhesive surface of the heat-expandable pressure-sensitive adhesive layer may also be protected by the back surface of the base material by subjecting the back surface of the base material to a mold releasing treatment.

(Heat-Expandable Layer)

The heat-expandable layer contains a foaming agent for the purpose of imparting heat expansion properties. For that reason, in the state that plural adherends are stuck on the adhesive surface of the heat-peelable pressure-sensitive adhesive sheet, the heat-peelable pressure-sensitive adhesive sheet is partially heated at an arbitrary time to foam and/or expand the foaming agent contained in a portion of the partially heated heat-expandable layer, whereby the heat-expandable layer partially expands; and the adhesive surface corresponding to the expanded portion unevenly deforms due to this partial expansion of the heat-expandable layer, whereby an adhesive area between the adhesive layer and the adherend is reduced so that an adhesive strength between the foregoing unevenly deformed adhesive surface and the adherend is reduced. Thus, it is possible to release the adherend as stuck onto the adhesive surface from the heat-peelable pressure-sensitive adhesive sheet.

The foaming agent which is used in the heat-expandable layer is not particularly limited, but a heat-expandable microsphere can be suitably used. The foaming agent can be used singly or in combination of two or more kinds thereof. The heat-expandable microsphere is not particularly limited but can be properly chosen among known heat-expandable microspheres (for example, various inorganic heat-expandable finer spheres and organic heat-expandable microspheres). As the heat-expandable microsphere, a microencapsulated foaming agent can be suitably used from the viewpoint of easy mixing operation. Examples of such a heat-expandable microsphere include microspheres resulting from inclusion of a substance capable of easily causing gasification and expansion by heating (for example, isobutane, propane, and heptane) in a shell having elasticity. In many cases, the foregoing shell is formed of a thermally fusible substance or a substance which is ruptured by heat expansion. Examples of the substance capable of forming the foregoing shell include a vinylidene chloride-acrylonitrile copolymer, polyvinyl alcohol, polyvinyl butyral, polymethyl methacrylate, polyacrylonitrile, polyvinylidene chloride, and polysulfone. The heat-expandable microsphere can be produced by a usual method such as a coacervation method and an interfacial polymerization method. Incidentally, the heat-expandable microsphere also includes commercially available products such as MATSUMOTO MICROSPHERE (a trade name, manufactured by Matsumoto Yushi-Seiyaku Co., Ltd.).

In the invention, foaming agents other than the thermo-expandable microsphere can also be used as the foaming agent. As such foaming agents, a variety of foaming agents such as various inorganic foaming agents and organic foaming agents can be properly chosen and used. Representative examples of inorganic foaming agents include ammonium carbonate, ammonium hydrogencarbonate, sodium hydrogencarbonate, ammonium nitrite, sodium borohydride, and a variety of azides. Also, representative examples of organic foaming agents include water; chlorofluorinated alkane based compounds (for example, trichloromonofluoromethane and dichloromonofluoromethane); azo based compounds (for example, azobisiisobutyronitrile, azodicarbonamide, and barium azodicarboxylate); hydrazine based compounds (for example, p-toluenesulfonyl hydrazide, diphenylsulfone-3,3'-disulfonyl hydrazide, 4,4'-oxybis(benzenesulfonyl hydrazide, and allyl bis(sulfonyl hydrazide); semicarbazide based compounds (for example, p-tolylenesulfonyl semicarbazide and 4,4'-oxybis(benzenesulfonyl semicarbazide); triazole based compounds (for example, 5-morpholyl-1,2,3,4-thiatriazole); and N-nitroso based compounds (for example, N,N'-dinitrosopentamethyl-enetetramine and N,N'-dimethyl-N,N'-dinitrosoterephthal-amide).

In the invention, in order to lower an adhesive strength of the heat-expandable layer efficiently and stably by the heat treatment, a foaming agent having an adequate strength such that it does not rupture until the volume expansion coefficient becomes 5 times or more, preferably 7 times or more, and especially 10 times or more.

The amount of blending of the foaming agent (for example, a heat-expandable sphere) can be properly set up depending upon lowering properties in the expansion ratio or adhesive strength of the heat-expandable layer. However, for example, it is generally from 1 to 150 parts by weight, preferably from 10 to 130 parts by weight, and more preferably from 25 to 100 parts by weight based on 100 parts by weight of the base polymer which forms the heat-expandable layer.

Incidentally, in the case where a heat-expandable microsphere is used as the foaming agent, the particle size (mean particle size) of the subject heat-expandable microsphere can be properly chosen depending upon the thickness of the heat-expandable layer or the like. For example, the mean particle size of the heat-expandable microsphere can be chosen within the range of not more than 100 μm (preferably not more than 80 μm, more preferably from 1 to 50 μm, and especially from 1 to 30 μm). Incidentally, the adjustment of the particle size of the heat-expandable microsphere may be carried out in a formation step of the heat-expandable microsphere, or may be carried out by classification or other mesures after the formation. In the heat-expandable microsphere, it is preferable that the particle size is made uniform.

The heat-expandable layer is only required to contain the foaming agent. For example, it may be a layer in which a foaming agent is dispersed in a viscoelastic substance (heat-expandable viscoelastic layer). Such a heat-expandable viscoelastic layer can be formed of a foaming agent-containing viscoelastic composition resulting from blending a foaming agent for imparting heat expansion properties in a viscoelastic substance. It is important that the viscoelasticity in the viscoelastic substance is such that foaming and/or expansion of the foaming agent by the heat treatment is not hindered. That is, as the viscoelastic substance, at least one kind of a viscoelastic substance which does not hinder the heat expansion of the foaming agent can be used. For example, as such a viscoelastic substance, rubbers, resins and adhesives having proper viscoelasticity, which allow foaming and/or expansion of the foaming agent at the time of heating, can be used. Examples of the viscoelastic substance include rubbers, thermosetting resins, thermoplastic resins, pressure sensitive adhesives (adhesives), energy ray curable resins, and energy ray curable adhesives. The viscoelastic substance can be used singly or in combination of two or more kinds thereof.

More concretely, in the viscoelastic substance, examples of rubbers include a variety of rubbers such as natural rubbers, synthetic rubbers, and silicone rubbers. Furthermore, examples of thermosetting resins include epoxy based resins, unsaturated ester based resins, thermosetting acrylic resins, and phenol based resins; and examples of thermoplastic resins include saturated polyester based resins, thermoplastic polyurethane based resins, amide based resins, imide based resins, thermoplastic acrylic resins, olefin based resins, and vinyl acetate based resins.

Moreover, examples of pressure sensitive adhesives include known adhesives such as a variety of pressure sensitive adhesives (for example, rubber based pressure sensitive adhesives, acrylic pressure sensitive adhesives, silicone based pressure sensitive adhesives, vinyl alkyl ether based pressure sensitive adhesives, polyester based pressure sensitive adhesives, polyamide based pressure sensitive adhesives, urethane based pressure sensitive adhesives, and fluorine based adhesives); and creep characteristic improvement type adhesives having a heat fusible resin having a melting point of not higher than about 200° C. blended in the foregoing pressure sensitive adhesive (adhesive) (see, for example, JP-A-56-61468, JP-A-61-174857, JP-A-63-17981, and JP-A-56-13040).

As the pressure sensitive adhesive, rubber based pressure sensitive adhesives and acrylic pressure sensitive adhesives are preferable. In particular, acrylic pressure sensitive adhesives can be suitably used. Examples of rubber based pressure sensitive adhesives include rubber based pressure sensitive adhesives containing, as a base polymer, a natural rubber or every kind of synthetic rubbers [for example, polyisoprene rubbers, styrene/butadiene block copolymer (SB) rubbers, styrene/isoprene block copolymer (SI) rubbers, styrene/isoprene/styrene block copolymer (SIS) rubbers, styrene/butadiene/styrene block copolymer (SBS) rubbers, styrene/isoprene/butadiene/styrene block copolymer (SIBS) rubbers, styrene/ethylene/butylene/styrene block copolymer (SEBS) rubbers, styrene/ethylene/propylene/styrene block copolymer (SEPS) rubbers, styrene/ethylene/propylene block copolymer (SEP) rubbers, regenerated rubbers, polyisobutyrene, and modified products thereof].

Furthermore, examples of acrylic pressure sensitive adhesives include acrylic pressure sensitive adhesives containing, as a base polymer, an acrylic polymer (homopolymer or copolymer) using one or two or more kinds of a (meth) acrylic acid alkyl ester as a monomer component. In the foregoing acrylic pressure sensitive adhesives, examples of the (meth) acrylic acid alkyl ester includes (meth)acrylic acid $C_{1-20}$ alkyl esters [preferably (meth) acrylic $C_{4-18}$ alkyl (linear or branched alkyl) esters] such as methyl (meth)acrylate, ethyl (meth)acrylate, propyl (meth)acrylate, isopropyl (meth)acrylate, butyl (meth)acrylate, isobutyl (meth)acrylate, sec-butyl (meth)acrylate, t-butyl (meth)acrylate, pentyl (meth)acrylate, hexyl (meth)acrylate, heptyl (meth)acrylate, octyl (meth) acrylate, 2-ethylhexyl (meth)acrylate, isooctyl (meth)acrylate, nonyl (meth)acrylate, isononyl (meth)acrylate, decyl (meth)acrylate, isodecyl (meth)acrylate, undecyl (meth)acrylate, dodecyl (meth)acrylate, tridecyl (meth)acrylate, tetradecyl (meth)acrylate, pentadecyl (meth)acrylate, hexadecyl (meth)acrylate, heptadecyl (meth)acrylate, octadecyl (meth) acrylate, nonadecyl (meth)acrylate, and eicosyl (meth)acrylate.

Incidentally, for the purpose of modifying a cohesive strength, heat resistance, crosslinking properties and the like, etc., the foregoing acrylic polymer may contain a unit corresponding to other monomer component which is copolymerizable with the foregoing (meth)acrylic acid alkyl ester as the need arises. Examples of such a monomer component include carboxyl group-containing monomers (for example, acrylic acid, methacrylic acid, itaconic acid, maleic acid, fumaric acid, crotonic acid, and carboxyethyl acrylate); acid anhydride group-containing monomers (for example, maleic anhydride and itaconic anhydride); hydroxyl group-containing monomers (for example, hydroxyethyl (meth)acrylate, hydroxypropyl (meth)acrylate, and hydroxybutyl (meth) acrylate); (N-substituted or unsubstituted) amide based monomers (for example, (meth)acrylamide, N,N-dimethyl (meth)acrylamide, N-butyl (meth)acrylamide, N-methylol (meth)acrylamide, and N-methylolpropane (meth)acrylamide); vinyl ester based monomers (for example, vinyl acetate and vinyl propionate); styrene based monomers (for example, styrene and α-methylstyrene); vinyl ether based monomers (for example, vinyl methyl ether and vinyl ethyl ether); cyano acrylate based monomers (for example, acrylonitrile and methacrylonitrile); epoxy group-containing acrylic monomers (for example, glycidyl (meth)acrylate); olefin or diene based monomers (for example, ethylene, propylene, isoprene, butadiene, and isobutylene); (substituted or unsubstituted) amino group-containing monomers (for example, aminoethyl (meth)acrylate, N,N-dimethylaminoethyl (meth)acrylate, and t-butylaminoethyl (meth)acrylate); (meth)acrylic acid alkoxyalkyl based monomers (for example, methoxyethyl (meth)acrylate and ethoxyethyl (meth)acrylate); nitrogen atom-containing ring-containing monomers (for example, N-vinylpyrrolidone, N-methylvinylpyrrolidone, N-vinylpyridine, N-vinylpiperidone, N-vinylpyrimidine, N-vinylpiperazine, N-vinylpyrazine, N-vinylpyrrole, N-vinylimidazole, N-vinyloxazole, N-vinylmorpholine, and N-vinylcaprolactone); N-vinylcarbamic acid amides; sulfonic acid group-containing monomers (for example, styrenesulfonic acid, allylsulfonic acid, (meth)acrylamide propanesulfonic acid, and sulfopropyl (meth)acrylate); phosphoric acid group-containing monomers (for example, 2-hydroxy-ethylacryloyl phosphate); maleimide based monomers (for example, N-cyclohexylmaleimide, N-isopropylmaleimide, N-laurylmaleimide, and N-phenylmaleimide); itaconimide based monomers (for example, N-methylitaconimide, N-ethylitaconimide, N-butylitaconimide, N-octylitaconimide, N-2-ethylhexylitaconimide, N-cyclohexylitaconimide, and N-laurylitaconimide); succinicmide based monomers (for example, N-(meth)acryloyloxymethylene succinimide, N-(meth)acryloyl-6-oxyhexamethylene succinimide, and N-(meth)acryloyl-8-oxyoctamethylene succinmide); glycol based acrylic acid ester monomers (for example, polyethylene glycol (meth)acrylate and polypropylene glycol (meth)acrylate); oxygen atom-containing hetero ring-containing monomers (for example, tetrahydrofuryl (meth)acrylate); fluorine atom-containing acrylic acid ester monomers (for example, fluorine based (meth)acrylates); silicon atom-containing acrylic acid ester monomers (for example, silicone based (meth)acrylates); and polyfunctional monomers (for example, hexanediol di(meth)acrylate, (poly)ethylene glycol di(meth)acrylate, (poly)propylene glycol di(meth)acrylate, neopentyl glycol di(meth) acrylate, pentaerythritol di(meth)acrylate, trimethylolpropane tri(meth)acrylate, pentaerythritol tri (meth)acrylate, dipentaerythritol hexa(meth)acrylate, epoxy acrylate, polyester acrylate, urethane acrylate, divinylbenzene, butyl di(meth)acrylate, and hexyl di(meth) acrylate). These monomer components can be singly or in combination of two or more kinds thereof.

Incidentally, the pressure sensitive adhesive is preferably a pressure sensitive adhesive containing, as a base, a polymer having a dynamic elastic modulus in the range of from 5,000 to 1,000,000 Pa at from the ambient temperature to 150° C. in view of a balance of lowering properties between the adequate adhesive strength before the heat treatment and the adhesive strength after the heat treatment.

In addition to the polymer component such as adhesive components (base polymers), the pressure sensitive adhesive may contain proper additives such as a crosslinking agent (for example, isocyanate based crosslinking agents, epoxy based crosslinking agents, and melamine based crosslinking agents), a tackifier (for example, ones which are solid, semisolid or liquid at the ambient temperature, such as rosin derivative resins, polyterpene resins, petroleum resins, and oil-soluble phenol resins), a plasticizer, a filler, an antiaging agent, and a surfactant, depending upon the type of the pressure sensitive adhesive.

In particular, the pressure sensitive adhesive can be suitably used as such a viscoelastic substance. In this way, by using the pressure sensitive adhesive as the viscoelastic substance, it is possible to form a heat-expandable pressure-sensitive adhesive layer as the heat-expandable layer. That is, the heat-expandable pressure-sensitive adhesive layer is formed of the foaming agent for imparting heat expansion properties and the pressure sensitive adhesive for imparting tackiness.

For example, the heat-expandable pressure-sensitive adhesive layer can be formed by a usual method for mixing a pressure sensitive adhesive, a foaming agent (for example, a heat-expandable microsphere, etc.), and optionally a solvent and other additives to form a layer in a sheet-like form. Concretely, for example, the heat-expandable pressure sensitive adhesive can be formed by a method for coating a mixture containing a pressure sensitive adhesive, a foaming agent (for example, a heat-expandable microsphere, etc.), and optionally a solvent and other additives on a base material or a rubber-like organic elastic layer as described later, a method for coating the foregoing mixture on an adequate separator (for example, release paper) to form a heat-expandable pressure-sensitive adhesive layer and transferring it onto a base material or a rubber-like organic elastic layer, or other methods. In coating the heat-expandable pressure-sensitive adhesive layer, units which are used for spin coating or in general adhesive coating machines (for example, a fountain coater and a kiss coater) can be used. Incidentally, the heat-expandable pressure-sensitive adhesive layer may be a single layer or may be constructed of plural layers.

As a matter of course, in the case where the heat-expandable layer is not a heat-expandable pressure-sensitive adhesive layer, the heat-expandable layer can be formed by a formation in accordance with the foregoing formation method of a heat-expandable pressure-sensitive adhesive layer.

The thickness of the heat-expandable layer (for example, a heat-expandable pressure-sensitive adhesive layer) can be properly chosen depending upon lowering properties of the adhesive strength or the like, etc. and is, for example, from about 5 to 300 μm (preferably from 20 to 150 μm). However, in the case where a heat-expandable microsphere is used as the foaming agent, it is important that the thickness of the heat-expandable layer is thicker than the maximum particle size of the heat-expandable microsphere as contained. When the thickness of the heat-expandable layer is too thin, the surface smoothness is deteriorated due to unevenness of the heat-expandable microsphere, and the adhesion before heating (in the unexpanded state) is lowered. Also, a degree of deformation of the heat-expandable layer by the heating treatment is small, and the adhesive strength is hardly lowered with any interruption. On the other hand, when the thickness of the heat-expandable layer is too thick, cohesive failure is liable to be generated in the heat-expandable layer after expansion and/or foaming by the heating treatment, and adhesive transfer is possibly generated in the adherend.

(Base Material)

In the heat-peelable pressure-sensitive adhesive sheet as shown in FIG. 1, a supporting base material (sometimes referred to simply as "base material") is used. Such a base material can be used as a supporting matrix for the heat-expandable layer or the like. Examples of the base material which can be used include proper thin sheets such as paper based base materials (for example, paper); fiber based base materials (for example, woven fabrics, non-woven fabrics, felts, and nets); metal based base materials (for example, metal foils and metal plates); plastic based base materials (for example, plastic films and sheets); rubber based base materials (for example, rubber sheets); foamed materials (for example, foamed sheets); and laminates thereof (especially, laminates of a plastic based base material and other base material and laminates between plastic films (or sheets)). As the base material, ones having excellent heat resistance such that they are not melted at the heating treatment temperature of the heat-expandable layer are preferable in view of handling properties after heating or the like. As the base material, plastic based base materials such as plastic films or sheets can be suitably used. Examples of a raw material in such plastic films or sheets include olefin based resins containing an α-olefin as a monomer component (for example, polyethylene (PE), polypropylene (PP), an ethylene-propylene copolymer, and an ethylene-vinyl acetate copolymer (EVA)); polyesters (for example, polyethylene terephthalate (PET), polyethylene naphthalate (PEN), and polybutylene terephthalate (PBT)); polyvinyl chloride (PVC); polyphenylene sulfide (PPS); amide based resins (for example, polyamide (nylon) and wholly aromatic polyamide (aramid); and polyetheretherketone (PEEK). These raw materials can be used singly or in combination of two or more kinds thereof.

Incidentally, in the case where a plastic based base material is used as the base material, deformation properties such as a stretch ratio may be controlled by a stretching treatment or the like. Also, in using, as the base material, a radiation curable substance in the heat-expandable layer, etc., it is preferred to use a base material which does not hinder the transmission of radiations.

The thickness of the base material can be properly chosen depending upon the strength or flexibility, the intended purpose for use, and the like. For example, the thickness of the base material is generally not more than about 1,000 μm (for example, from about 1 to 1,000 μm), preferably from about 1 to 500 μm, more preferably from about 3 to 300 μm, and especially from about 5 to 250 μm. However, the thickness of the base material is not limited to the foregoing range. Incidentally, the base material may be a single layer or may be in the laminated form.

In order to enhance adhesion to the adjacent layer (for example, the heat-expandable layer or the rubber-like organic elastic layer), the surface of the base material may be subjected to a usual surface treatment such as an oxidation treatment by a chemical or physical treatment (for example, a corona treatment, a chromic acid treatment, ozone exposure, flame exposure, high-voltage electric shock exposure, and an ionized radiation treatment). Furthermore, in order to impart release properties against the heat-expandable layer or the like, for example, the surface of the base material may be subjected to a coating treatment with a releasing agent (for example, silicone based resins and fluorine based resins).

Incidentally, it is possible to provide the heat-expandable layer on at least one surface (one surface or both surfaces) of the base material. Also, the base material may take a form in which it is embedded in the heat-expandable layer.

(Interlayer)

The heat-peelable pressure-sensitive adhesive sheet of the invention may have one or two or more interlayers, for example, between the base material and the heat-expandable layer. Examples of such an interlayer include a coating layer of a releasing agent for the purpose of imparting release properties and a coating layer of an undercoating agent for the purpose of enhancing an adhesion strength. Incidentally, examples of other interlayers than the coating layer of a releasing agent and the coating layer of an undercoating agent include a layer for the purpose of imparting good deformation properties, a layer for the purpose of increasing an adhesive area against an adherend (for example, a semiconductor wafer), a layer for the purpose of enhancing an adhesive strength, a layer for the purpose of well following up the surface shape of an adherend (for example, a semiconductor wafer), a layer for the purpose of enhancing treatment properties of a reduction of the adhesive strength by heating, and a layer for the purpose of enhancing release properties from an adherend (for example, a semiconductor wafer) after heating. In particular, in view of imparting deformation properties of the heat-peelable pressure-sensitive adhesive sheet and enhancing release properties after heating, the rubber-like organic elastic layer can be provided as the interlayer between the base material and the heat-expandable layer as shown in FIG. 1.

In the heat-peelable pressure-sensitive adhesive sheet 1 as shown in FIG. 1, the heat-expandable pressure-sensitive adhesive layer 4 as the heat-expandable layer is formed on the supporting base material (base material) 2 via the rubber-like organic elastic layer 3. In this way, by providing the rubber-like organic elastic layer, in adhering the heat-peelable pressure-sensitive adhesive sheet to the adherend, it is possible to increase the adhesive area by making the surface of the foregoing heat-peelable pressure-sensitive adhesive sheet well follow up the surface shape of the adherend. Also, in thermally releasing the heat-peelable pressure-sensitive adhesive sheet from the adherend, it is possible to control heat expansion of the heat-expandable layer to a high degree (with good precision) and expand the heat-expandable layer preferentially and uniformly in the thickness direction. That is, in adhering the heat-peelable pressure-sensitive adhesive sheet to the adherend, the rubber-like organic elastic layer can work to provide a large adhesive area by making the surface thereof follow up the surface shape of the adherend. Also, in heating the heat-expandable layer to foam and/or expand it for the purpose of releasing the adherend from the heat-peelable pressure-sensitive adhesive sheet, the rubber-like organic elastic layer can work to promote the formation of a weaving structure by reducing a restraint of the foaming and/or expansion in the plane direction of the heat-peelable pressure-sensitive adhesive sheet to cause a three-dimensional structure change of the thermo-expandable layer.

Incidentally, as described previously, the rubber-like organic elastic layer is a layer which is provided as the need arises and may be not always provided. It is preferable that the rubber-like organic elastic layer is provided for the purpose of enhancing fixing properties of the adherend at the time of processing and release properties after heating.

It is preferable that the rubber-like organic elastic layer is provided in the state that it is superimposed on the surface of the heat-expandable layer in the base material side. Incidentally, the rubber-like organic elastic layer can be provided as a layer other than the interlayer between the base material and the heat-expandable layer. The rubber-like organic elastic layer can be interposed on one surface of both surfaces of the base material.

It is preferable that the rubber-like organic elastic layer is, for example, formed of a natural rubber, a synthetic rubber or a synthetic resin having rubber elasticity, whose D type Shore D type hardness on the basis of ASTM D-2240 is not more than 50, and especially not more than 40. Examples of the foregoing synthetic rubber or synthetic resin having rubber elasticity include synthetic rubbers (for example, nitrile based rubbers, diene based rubbers, and acrylic rubbers); thermoplastic elastomers (for example, polyolefin based elastomers and polyester based elastomers); and synthetic resins (for example, an ethylene-vinyl acetate copolymer, polyurethane, polybutadiene, and soft polyvinyl chloride). Incidentally, even in rigid polymers such as polyvinyl chloride, rubber elasticity can be revealed depending upon a combination with a blending agent such as a plasticizer and a softener. Such a composition can also be used as a constituent material of the foregoing rubber-like organic elastic layer. Also, a pressure sensitive adhesive substance such as the foregoing pressure sensitive adhesive (for example, rubber based pressure sensitive adhesives and acrylic pressure sensitive adhesives) constituting the heat-expandable pressure-sensitive adhesive layer can also be used a constituent material of the rubber-like organic elastic layer.

The rubber-like organic elastic layer can be, for example, formed by a formation method such as a system for coating a coating liquid containing a rubber-like organic elastic layer forming material (for example, the foregoing natural rubber, synthetic rubber or synthetic resin having rubber elasticity) on a base material (coating method); a system for adhering a film made of the foregoing rubber-like organic elastic layer forming material or a laminated film having a layer made of the foregoing rubber-like organic elastic layer forming material formed on one or more heat-expandable pressure-sensitive adhesive layers to a base material (dry lamination method); and a system for co-extruding a resin composition containing a base material constituent material and a resin composition containing the foregoing rubber-like organic elastic layer forming material (co-extrusion method).

Incidentally, the rubber-like organic elastic layer may be formed of a pressure sensitive adhesive substance containing, as the major component, a natural rubber, a synthetic rubber, or a synthetic resin having rubber elasticity. Also, the rubber-like organic elastic layer may be formed of a foamed film composed mainly of such a component, etc. Foaming can be carried out by a usual method, for example, a method by mechanical stirring, a method of utilizing a reaction formed gas, a method of using a foaming agent, a method of removing a soluble substance, a method by spraying, a method of forming a syntactic foam, and a sintering method.

The thickness of the interlayer such as the rubber-like organic elastic layer is, for example, from about 5 to 300 µm, and preferably from about 20 to 150 µm. Incidentally, for example, in the case where the interlayer is the rubber-like organic elastic layer, when the thickness of the rubber-like organic elastic layer is too thin, a three-dimensional structure change after thermal foaming cannot be formed, and release properties may possibly be deteriorated. The interlayer such as the rubber-like organic elastic layer may be a single layer or may be constructed of two or more layers.

Also, in using a radiation curable substance in the heat-expandable layer, etc. as the interlayer such as the rubber-like organic elastic layer, it is preferred to use a material which does not hinder the transmission of radiations.

(Separator)

In FIG. 1, though a separator (release liner) is used as a protective material of the heat-expandable pressure-sensitive adhesive layer as the heat-expandable layer, the separator may be not always provided. Incidentally, in the case where a pressure-sensitive adhesive layer other than the heat-expandable pressure-sensitive adhesive layer is provided, a separator (release liner) may also be used as a protective material of that pressure-sensitive adhesive layer.

Incidentally, the separator is released in utilizing the pressure-sensitive adhesive layer as protected by the subject separator (that is, in sticking an adherend to the pressure-sensitive adhesive layer as protected by the separator).

As such a separator, usual release paper or the like can be used. Concretely, for example, base materials having a release layer made of a plastic film or paper having been subjected to a surface treatment with a releasing agent (for example, silicone based, long-chain alkyl based and fluorine based materials, and molybdenum sulfide); lowly adhesive base materials made of a fluorine based polymer (for example, polytetrafluoroethylene, polychlorotrifluoroethylene, polyvinyl fluoride, polyvinylidene fluoride, a tetrafluoroethylene/hexafluoropropylene copolymer, and a chlorofluoroethylene/vinylidene fluoride copolymer); lowly adhesive base materials made of a non-polar polymer such as olefin based resins (for example, polyethylene and polypropylene); and so on can be used. Incidentally, it is also possible to use the separator as the base material for supporting the heat-expandable layer such as the heat-expandable pressure-sensitive adhesive layer.

Incidentally, the separator can be formed by a known and/or usual method. Also, the separator is not particularly limited with respect to the thickness or the like.

(Other Layers)

In the invention, so far as the heat-peelable pressure-sensitive adhesive sheet is provided with a heat-expandable layer containing a foaming agent, for example, it may be a heat-peelable pressure-sensitive adhesive sheet having a base material (base material-provided heat-peelable pressure-sensitive adhesive sheet) as shown in FIG. 1, or may be a heat-peelable pressure-sensitive adhesive sheet not having a base material (base material-less heat-peelable pressure-sensitive adhesive sheet). In the case where the heat-peelable pressure-sensitive adhesive sheet is a base material-provided heat-peelable pressure-sensitive adhesive sheet, it is only required that the heat-expandable layer is formed on at least one surface of the base material. Examples thereof include (1) a heat-peelable pressure-sensitive adhesive sheet in the form that the heat-expandable layer is formed on one surface of the base material, (2) a heat-peelable pressure-sensitive adhesive sheet in the form that the heat-expandable layer is formed on the both surfaces of the base material, and (3) a heat-peelable pressure-sensitive adhesive sheet in the form that the thermo-expandable layer is formed on one surface of the base material and that a non-heat-expandable pressure-sensitive adhesive layer (pressure-sensitive adhesive layer not having heat expansion properties) is formed on the other surface of the base material.

Incidentally, in the case where the heat-expandable layer is not a heat-expandable pressure-sensitive adhesive layer, in the heat-peelable pressure-sensitive adhesive sheet, it is important that a non-heat-expandable pressure-sensitive adhesive layer is formed on the heat-expandable layer. On this occasion, in the heat-peelable pressure-sensitive adhesive sheet, the surface of the non-thermo-expandable pressure-sensitive adhesive layer on the thermo-expandable layer can be utilized as the pressure sensitive adhesive surface. Also, in the case where the thermo-expandable layer is a heat-expandable pressure-sensitive adhesive layer, since the surface of this heat-expandable pressure-sensitive adhesive layer can be utilized as the pressure sensitive adhesive surface, a non-heat-expandable pressure-sensitive adhesive layer may not be formed on the heat-expandable pressure-sensitive adhesive layer as the heat-expandable layer.

Such a non-heat-expandable pressure-sensitive adhesive layer (for example, a non-heat-expandable pressure-sensitive adhesive layer to be formed on the heat-expandable layer and a non-heat-expandable pressure-sensitive adhesive layer to be formed on the surface of the base material in the opposite side to the heat-expandable layer) can be formed of a pressure sensitive adhesive (for example, a rubber based pressure sensitive adhesive and an acrylic pressure sensitive adhesive) as enumerated as the pressure sensitive adhesive to be used in the foregoing heat-expandable pressure-sensitive adhesive layer. Such a pressure sensitive adhesive can be used singly or in combination of two or more kinds thereof. The pressure sensitive adhesive for forming the non-thermo-expandable pressure-sensitive adhesive layer may be blended with a known and/or usual additive such as a plasticizer, a filler, a surfactant, an antiaging agent, and a tackifier.

The thickness of the non-heat-expandable pressure-sensitive adhesive layer is not particularly limited but can be properly chosen depending upon the intended purpose of use. The thickness of the non-heat-expandable pressure-sensitive adhesive layer may be, for example, not more than 300 μm (for example, from 1 to 300 μm, and preferably from 5 to 100 μm). Incidentally, as a method for forming the non-heat-expandable pressure-sensitive adhesive layer, the same method as in the foregoing heat-expandable pressure-sensitive adhesive layer (for example, a method for coating on the base material and a method for coating on the separator to form a pressure-sensitive adhesive layer and then transferring it onto the base material) can be utilized. Incidentally, the non-thermo-expandable pressure-sensitive adhesive layer may be a single layer or may be constructed of plural layers.

Though the heat-peelable pressure-sensitive adhesive sheet of the invention may have a form of a pressure sensitive adhesive double coated sheet in which the both surfaces thereof are an adhesive surface, it preferably has a form of an adhesive sheet in which only one surface thereof is an adhesive surface. In consequence, it is suitable that the heat-peelable pressure-sensitive adhesive sheet is a heat-peelable pressure-sensitive adhesive sheet in the form a in which a heat-expandable layer (especially, a heat-expandable pressure-sensitive adhesive layer) is formed on one surface of the base material.

Furthermore, the heat-peelable pressure-sensitive adhesive sheet may be formed in the form in which it is wound in the roll shape or may be formed in the form in which the sheets are laminated. That is, the heat-peelable pressure-sensitive adhesive sheet can have a sheet-like or tape-like form. Incidentally, the heat-peelable pressure-sensitive adhesive sheet in the state or form in which it is wound in the roll shape may have a state or form in which it is wound in the roll shape in the state that the pressure sensitive adhesive surface thereof is protected by a separator, may have a state or form in which it is wound in the roll shape in the state that the pressure sensitive adhesive surface thereof is protected by a release treatment layer (back surface treatment layer) as formed on the other surface of the base material.

(Thermal Release Method)

According to the thermal release method of an adherend of the invention, after previously heating a sticking site of a part of an adherend of plural adherends as stuck to the foregoing heat-peelable pressure-sensitive adhesive sheet (namely, a heat-peelable pressure-sensitive adhesive sheet provided with a heat-expandable layer containing a foaming agent) at a temperature at which the heat-expandable layer of the heat-peelable pressure-sensitive adhesive sheet does not expand, the sticking site of the foregoing adherend in the heat-peelable pressure-sensitive adhesive sheet is heated at a temperature at which the heat-expandable layer expands, thereby selectively releasing the adherend. That is, it is important that the thermal release method of an adherend of the invention is provided with at least a step for previously heating a sticking site of an adherend to be released of plural adherends at a temperature at which the heat-expandable layer of the heat-peelable pressure-sensitive adhesive sheet does not expand (sometimes referred to as "pre-heating step") and a step for heating the sticking side of the foregoing adherend to be released at a temperature at which the heat-expandable layer expands, thereby selectively releasing the adherend (sometimes referred to as "partial thermal release step").

In this way, according to the thermal release method of an adherend of the invention, in order to release the adherend, prior to heating the sticking site of the adherend to be released at a temperature at which the heat-expandable layer expands, the sticking side of an adherend to be released of plural adherends is previously heated at a temperature at which the heat-expandable layer of the heat-peelable pressure-sensitive adhesive sheet does not expand. Accordingly, after the heat treatment at a temperature at which this heat-expandable layer does not expand, in heating the sticking site of the adherend to be released at a temperature at which the heat-expandable layer expands, thereby releasing the adherend, it is possible to rapidly heat the sticking site of the adherend to be released to a temperature at which the heat-expandable layer starts heat expansion. Also, it is possible to effectively shorten a time necessary for expansion and/or foaming of the foaming agent in the heat-expandable layer. Therefore, in partially heating the heat-peelable pressure-sensitive adhesive sheet to achieve release, it is possible to more rapidly perform the release treatment.

In the foregoing pre-heating step, a sticking site of an adherend to be released of plural adherends is previously heated at a temperature at which the heat-expandable layer of the heat-peelable pressure-sensitive adhesive sheet does not expand. On this occasion, the site to be previously heated may be at least the sticking site of the adherend to be released. Furthermore, the temperature for performing previous heating (sometimes referred to as "pre-heating temperature") may be a temperature at which the heat-expandable layer of the heat-peelable pressure-sensitive adhesive sheet does not expand and is not particularly limited so far as it is lower than the release start temperature of the heat-peelable pressure-sensitive adhesive sheet. That is, the "temperature at which the thermo-expandable layer does not expand" can be made a temperature lower than the "release start temperature of the heat-peelable pressure-sensitive adhesive sheet". Incidentally, it is preferable that the pre-heating temperature is not excessively lower than the release start temperature of the heat-peelable pressure-sensitive adhesive sheet from the viewpoint of rapidness of the release treatment. Concretely, the pre-heating temperature can be suitably chosen within a temperature range of from 30° C. lower than the release start temperature of the heat-peelable pressure-sensitive adhesive sheet or higher but lower than the release start temperature of the heat-peelable pressure-sensitive adhesive sheet [namely, when the "release start temperature of the heat-peelable pressure-sensitive adhesive sheet" is designated as "$T_0$", a temperature of ($T_0$–30° C.) or higher but lower than $T_0$], preferably a temperature of ($T_0$–20° C.) or higher but lower than $T_0$, and especially a temperature of ($T_0$–15° C.) or higher but lower than $T_0$. Incidentally, when the foregoing pre-heating temperature is a temperature exceeding ($T_0$–5° C.) but lower than $T_0$, the heat-expandable layer of the heat-peelable pressure-sensitive adhesive sheet may possibly expand and/or foam slightly. Accordingly, the pre-heating temperature is preferably a temperature of not higher than ($T_0-5°$ C.), and more preferably a temperature of not higher than ($T_0-8°$ C.) Thus, the pre-heating temperature is desirably a temperature of, for example, ($T_0-20°$ C.) or higher but not higher than ($T_0-5°$ C.) [preferably a temperature of ($T_0-15°$ C.) or higher but not higher than ($T_0-8°$ C.)].

In the invention, in the case where the heat-expandable layer is a heat-expandable pressure-sensitive adhesive layer, for example, the release start temperature of the heat-peelable pressure-sensitive adhesive sheet can be made a minimum heat treatment temperature at which an adhesive strength by the heat-expandable pressure-sensitive adhesive layer containing a foaming agent (for example, a heat-expandable microsphere) can be reduced by the heat treatment to not more than 10% of the adhesive strength before heating. In consequence, by measuring the minimum heat treatment temperature at which an adhesive strength by the heat-expandable pressure-sensitive adhesive layer containing a foaming agent (for example, a heat-expandable microsphere) can be reduced to not more than 10% of the adhesive strength before heating, it is possible to determine the foregoing release start temperature. Concretely, a polyethylene terephthalate film (a trade name: LUMIRROR S10#25, manufactured by Toray Industries, Inc.; sometimes referred to as "PET film") having a width of 20 mm and a thickness of 23 μm is stuck onto the surface of the heat-expandable pressure-sensitive adhesive layer of the heat-peelable pressure-sensitive adhesive sheet containing a foaming agent (for example, a heat-expandable microsphere) by using a hand roller such that air bubbles are not incorporated, thereby preparing a specimen. Thirty minutes after sticking the PET film, the PET film of this specimen is released at a release angle of 180°, an adhesive strength at this time is measured (measurement temperature: 23° C., stress rate: 300 mm/min, release angle: 180°), and the subject adhesive strength is designated as "initial adhesive strength". Also, the specimen as prepared by the foregoing method is heated for one minute by a hot plate as set up at each temperature (heat treatment temperature) in the state that it is weighed by a metal plate (stainless steel plate having a thickness of about 1 mm) as pre-treated at each temperature and then allowed to stand at 23° C. for 2 hours; thereafter, the PET film is released at a release angle of 180°; and an adhesive strength at this time is measured (measurement temperature: 23° C., stress rate: 300 mm/min, release angle: 180°), and the subject adhesive strength is designated as "adhesive strength after the heat treatment". Then, a minimum heat treatment temperature at which the adhesive strength after the heat treatment becomes not more than 10% of the initial adhesive strength is determined. This minimum heat treatment temperature is a release start temperature of the heat-expandable pressure-sensitive adhesive layer.

Incidentally, even in the case where the thermo-expandable layer is not a heat-expandable pressure-sensitive adhesive layer, the release start temperature of the heat-peelable pressure-sensitive adhesive sheet can be determined in the same manner as in the foregoing case where the heat-expandable layer is a heat-expandable pressure-sensitive adhesive layer.

Furthermore, in the foregoing partial thermal release step, a sticking site of an adherend to be released is heated at a temperature at which the thermo-expandable layer expands, thereby selectively releasing the adherend. On this occasion, it is important that the sticking site of the adherend to be subjected to a heat treatment is heated in the foregoing pre-heating step. By this heat treatment against the heat-peelable pressure-sensitive adhesive sheet, the thermally treated site selectively receives the heat, the foaming agent (for example, a heat-expandable microsphere) in the thermo-expandable layer expands (expanded part), and the adhesive strength lowers or vanishes, whereby the adherend as stuck to this partially thermally treated site can be released. On this occasion, since the sticking site of the adherend to be released is heated by the pre-heating step, in the partial thermal release step, the temperature of the sticking site of the thermally treated adherend rapidly increases to a prescribed temperature, whereby the foaming agent in the heat-expandable layer rapidly starts the expansion. On the other hand, a site far from the foregoing thermally treated site does not receive the heat due to the foregoing heat treatment, and a lowering of the adhesive strength based on the expansion of the foaming agent is not generated (un-expanded part). Accordingly, the adherend as stuck to the subject site of the heat-peelable pressure-sensitive adhesive sheet is kept in the state of sticking to the heat-peelable pressure-sensitive adhesive sheet.

In consequence, according to the thermal release method of the invention, it is possible to release only a desired adherend of plural adherends as stuck to the heat-peelable pressure-sensitive adhesive sheet selectively and rapidly (within a short time) by a simple operation.

In the partial thermal release step, it is important that the heat treatment temperature (sometimes referred to as "release heating temperature") in heating a sticking site of an adherend to be released in the heat-peelable pressure-sensitive adhesive sheet is a temperature of the release start temperature of the heat-peelable pressure-sensitive adhesive sheet or higher. Also, in general, when the foregoing release heating temperature is a temperature of at least 25° C. higher than the release start temperature of the heat-peelable pressure-sensitive adhesive sheet, the foaming agent (for example, a heat-expandable microsphere) which becomes expandable at the foregoing release start temperature is liable to deform. For that reason, in order to effectively thermally expand the foregoing foaming agent without causing deformation, though the release heating temperature varies depending upon the type of the foaming agent, etc., in general, it is important that the temperature is a temperature not exceeding 25° C. higher than the release start temperature of the heat-peelable pressure-sensitive adhesive sheet. Incidentally, the release heating temperature may exceed 25° C. higher than the release start temperature of the heat-peelable pressure-sensitive adhesive sheet. In this case, it is important to control the heat treatment time such that the foaming agent does not deform. In consequence, in the case where the release start temperature of the heat-peelable pressure-sensitive adhesive sheet is designated as $T_0$, the release heating temperature in heating and releasing a sticking site of an adherend as stuck to the heat-expandable layer such as the heat-expandable pressure-sensitive adhesive layer can be chosen within the range of $T_0$ or higher but lower than ($T_0+25°$ C.). Incidentally, in order to achieve release more rapidly, the release heating temperature in the partial thermal release step can be chosen within the temperature range of from ($T_0+25°$ C.) to ($T_0+100°$ C.), preferably from ($T_0+30°$ C.) to ($T_0+80°$ C.), and more preferably from ($T_0+35°$ C.) to ($T_0+70°$ C.).

Incidentally, the heat treatment time can be properly set up depending upon the type of the heat-peelable pressure-sensitive adhesive sheet, the type of the foaming agent, the nature of the adherend, the heat treatment temperature, the heating system, and the like.

A heating measure for partially heating a sticking site of an adherend as stuck to the heat-peelable pressure-sensitive adhesive sheet is not particularly limited so far as it is a heating measure capable of heating the sticking site of a desired adherend. However, a heating measure which is not only able to partially heat the heat-peelable pressure-sensitive adhesive sheet but also able to achieve heating corresponding to the shape of an adherend to be released can be suitably utilized. In consequence, in the pre-heating step, it is possible to previously partially heat the sticking site of the foregoing adherend to be released in the heat-peelable pressure-sensitive adhesive sheet with efficiency at a temperature at which the thermo-expandable layer of the heat-peelable pressure-sensitive adhesive sheet does not expand by the foregoing heating measure. On the other hand, in the partial thermal release step, it is possible to partially heat the sticking site of the foregoing adherend to be released in the heat-peelable pressure-sensitive adhesive sheet with efficiency at a temperature at which the heat-expandable layer expands by the foregoing heating measure, thereby selectively releasing the foregoing adherend.

Furthermore, in partially heating a sticking site of an adherend as stuck to the thermal release type pressure sensitive adhesive, heating can be achieved from at least one side of the sticking side of the adherend of the heat-peelable pressure-sensitive adhesive sheet and the opposite side thereto (the side in which the adherend is not stuck; sometimes referred to as "adherend-non-sticking side"). That is, the heating may be carried out from either one side of the adherend-sticking side or the adherend-non-sticking side (the side in which the adherend is not stuck) of the heat-peelable pressure-sensitive adhesive sheet, or the heating may be carried out from the both sides of the adherend-sticking side and the adherend-non-sticking side of the heat-peelable pressure-sensitive adhesive sheet. Incidentally, in the case where the heating is carried out from the both sides of the adherend-sticking side and the adherend-non-sticking side of the heat-peelable pressure-sensitive adhesive sheet, the heating may be carried out at the same time from the both sides of the adherend-sticking side and the adherend-non-sticking side, or the heating may be carried out first from either one side of the adherend-sticking side or the adherend-non-sticking side and subsequently from the other side.

In consequence, in the pre-heating step, it is possible to previously heat the sticking site of the adherend to be released from at least one side of the adherend-sticking side of the heat-peelable pressure-sensitive adhesive sheet and the opposite side thereto (in particular, the adherend-non-sticking side) at a temperature at which the heat-expandable layer does not expand. Also, in the partial thermal release step, after previously heating the sticking site of the adherend to be released at a temperature at which the heat-expandable layer does not expand, it is possible to heat the sticking site of the foregoing adherend to be released in the heat-peelable pressure-sensitive adhesive sheet from at least one side of the adherend-sticking side of the heat-peelable pressure-sensitive adhesive sheet and the opposite side thereto (in particular, the adherend-non-sticking side) at a temperature at which the heat-expandable layer expands.

In the invention, though plural adherends as stuck to the heat-peelable pressure-sensitive adhesive sheet may be plural adherends as prepared by sticking plural adherends to the heat-peelable pressure-sensitive adhesive sheet, it is preferred that they are preferably plural adherends as prepared by subjecting an adherend as stuck to the heat-peelable pressure-sensitive adhesive sheet to cutting processing into plural cut pieces. In consequence, it is preferable that the thermal release method of the invention is provided with a step for subjecting the adherend as stuck to the heat-peelable pressure-sensitive adhesive sheet to cutting processing into plural cut pieces (cutting processing step); a step for previously heating a sticking site of the cut piece to be released of the plural cut pieces at a temperature at which the heat-expandable layer of the heat-peelable pressure-sensitive adhesive sheet does not expand (pre-heating step); and a step for heating the sticking site of the cut piece to be released at a temperature at which the heat-expandable layer expands, thereby selectively releasing the cut piece (partial thermal release step).

Incidentally, in the cutting processing step, the method for subjecting an adherend as stuck to the heat-peelable pressure-sensitive adhesive sheet to cutting processing into plural cut pieces is not particularly limited so far as it is a cutting processing method and can be properly chosen depending upon the type of the adherend. For example, in the case where the adherend is a silicon wafer as described below, dicing processing is suitably employed as the cutting processing.

Incidentally, in the invention, in the pre-heating step, the sticking site of a part of an adherend to be released of plural adherends as stuck to the heat-peelable pressure-sensitive adhesive sheet is heated; and in the partial thermal release step, the sticking site of a part of an adherend to be released of plural adherends as stuck to the heat-peelable pressure-sensitive adhesive sheet is heated. Accordingly, it is possible to perform a heat treatment in the partial thermal release step (sometimes referred to as "release and heating treatment") in parallel to the heat treatment in the pre-heating step (sometimes referred to as "pre-heating treatment"). Concretely, with respect to the sticking site of a pre-heating treated adherend, it is possible to perform the pre-treating treatment regarding the sticking site of an adherend which has not been subjected to a pre-heating treatment, during a time of performing the release and heating treatment. That is, it is possible to perform the partial thermal release step in parallel to the pre-heating step. In other words, it is possible to perform the pre-heating step and the partial thermal release step as an integrated step.

Furthermore, in the invention, in the pre-heating step and the partial thermal release step, among plural adherends as stuck to the heat-peelable pressure-sensitive adhesive sheet (for example, plural cut pieces which have been subjected to cutting processing), the sticking side of a part of an adherend (cut piece) is heated. Accordingly, it is possible to perform the cutting processing treatment for subjecting an adherend which has not been subjected to cutting processing into plural cut pieces in parallel to the heat treatment (pre-heating treatment and/or release and heating treatment). That is, it is possible to perform the pre-heating step or the partial thermal release step in parallel to the cutting processing step. In other words, it is possible to perform the foregoing cutting processing step, the foregoing pre-heating step, and the foregoing partial thermal release step as an integrated step.

As a matter of course, after partially releasing and heating an adherend such as a cut piece, it is also possible to perform a step for separating the adherend such as a cut piece from the heat-peelable pressure-sensitive adhesive sheet and recovering it (separation and recovery step) as an integrated step with a step such as the partial thermal release step.

In consequence, it is possible to perform the cutting processing step and the separation and recovery step in parallel to the pre-heating step and the partial thermal release step. Concretely, the cutting processing step and the pre-heating step may be performed as an integrated step; the pre-heating step and the partial thermal release step may be performed as an integrated step; the partial thermal release step and the separation and recovery step may be performed as an integrated step; the cutting processing step, the pre-heating step, and the partial thermal release step may be performed as an integrated step; the pre-heating step, the partial thermal release step, and the separation and discovery step may be performed as an integrated step; and the cutting processing step, the pre-heating step, the partial thermal release step, and the separation and recovery step may be performed as an integrated step. In this way, by performing the cutting processing step, the pre-heating step, and the separation and recovery step in parallel to the partial thermal release step, it is possible to perform these steps extremely efficiently. Also, it is possible to largely enhance the productivity.

Incidentally, for one adherend, there is a proper order with respect to the foregoing steps. That is, it is important to perform the cutting processing step and the pre-heating step as a preliminary treatment of the partial thermal release step; and it is important to perform the separation and recovery step as a post-treatment of the partial thermal release step. For one adherend, it is possible to perform the cutting processing step, the pre-heating step, the partial thermal release step, and the separation and recovery step basically in this order.

As a matter of course, the heat-peelable pressure-sensitive adhesive sheet may be subjected to the cutting processing treatment, the pre-heating treatment, the release and heating treatment, and the separation and discovery treatment by repeating the procedures such that with respect to one adherend, the cutting processing treatment by the cutting processing step is performed, the pre-heating treatment by the pre-heating step is then performed, the release and heating treatment by the partial thermal release step is then performed, and the separation and recovery treatment by the separation and recovery step is then performed; and thereafter, with respect to other adherends, the cutting processing treatment by the cutting processing step is performed, the pre-heating treatment by the pre-heating step is then performed, the release and heating treatment by the partial thermal release step is then performed, and the separation and recovery treatment by the separation and recovery step is then performed.

(Apparatus for Thermal Adherend Release)

The apparatus for thermal adherend release of the invention is an apparatus for thermal adherend release for selectively releasing a part of an adherend of plural adherends as stuck to the foregoing heat-peelable pressure-sensitive adhesive sheet (namely, the heat-peelable pressure-sensitive adhesive sheet provided with a heat-expandable layer containing a foaming agent) by partially heating the heat-peelable pressure-sensitive adhesive sheet, which includes a first heating section (sometimes referred to as "pre-heating section") for previously heating the sticking site of the adherend to be released at a temperature at which the heat-expandable layer of the heat-peelable pressure-sensitive adhesive sheet does not expand; and a second heating section (sometimes referred to as "release and heating section") for, after previously heating by the first heating section, heating the sticking site of the adherend in the heat-peelable pressure-sensitive adhesive sheet at a temperature at which the heat-expandable layer expands, thereby selectively releasing the adherend.

Figure 2:
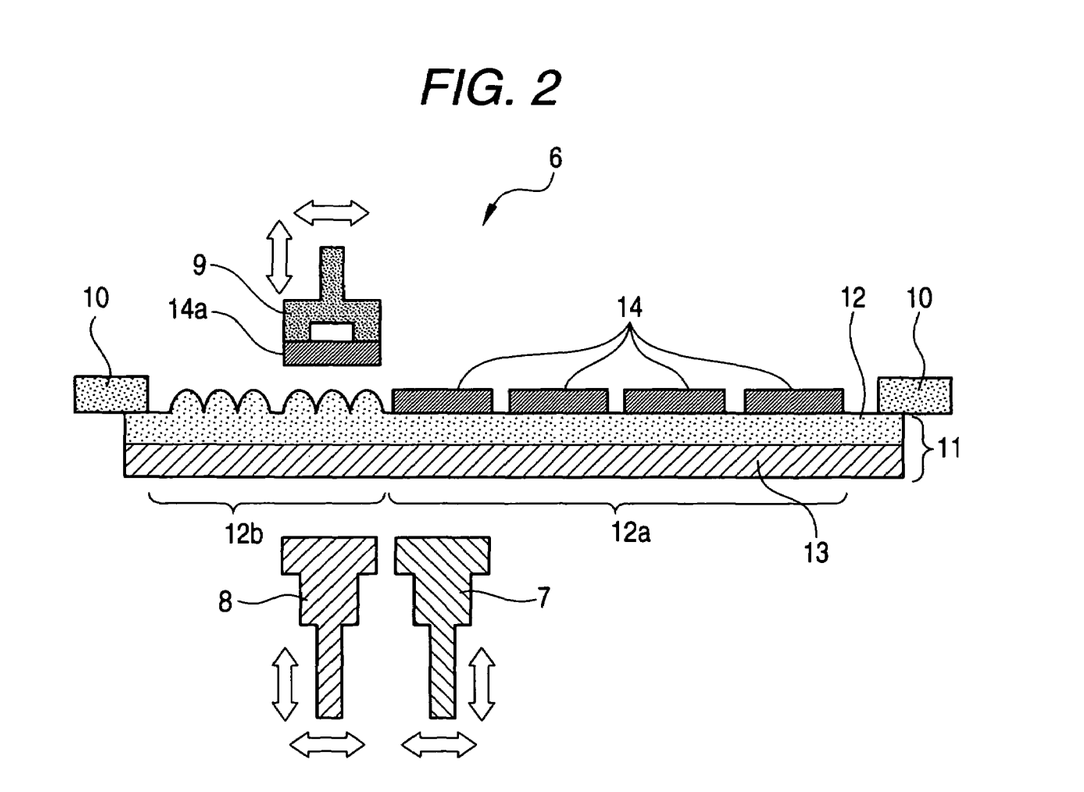
FIG. 2 is an outline view to partially show one embodiment of the thermal release device of an adherend of the invention.

As such an apparatus for thermal adherend release, for example, an apparatus for thermal adherend release as shown in FIG. 2 can be used. FIG. 2 is an outline view to partially show one embodiment of the apparatus for thermal adherend release of the invention. In FIG. 2, sign 6 stands for a heat release treatment section in the thermal release device of an adherend; sign 7 stands for a first heating section (pre-heating section); sign 8 stands for a second heating section (release and heating section); sign 9 stands for an adsorption nozzle; sign 10 stands for a fixing ring; sign 11 stands for a heat-peelable pressure-sensitive adhesive sheet; sign 12 stands for a heat-expandable pressure-sensitive adhesive layer; sign 12a stands for an un-expanded part where the heat-expandable pressure-sensitive adhesive layer 12 does not expand; sign 12b stands for an expanded part where the heat-expandable pressure-sensitive adhesive layer 12 expands; sign 13 stands for a base material; sign 14 stands for an adherend; and sign 14a stands for a released adherend.

In FIG. 2, as the apparatus for thermal adherend release, the heat release treatment section 6 in the thermal release device of an adherend is shown, and the heat-peelable pressure-sensitive adhesive sheet 11 to which a plural number of the adherends 14 stick is fixed by the fixing ring 10. This heat-peelable pressure-sensitive adhesive sheet 11 has such a construction that the heat-expandable pressure-sensitive adhesive layer 12 is formed on the base material 13. Also, in the pre-heating section 7, the surface part thereof is set up at a temperature at which the heat-expandable pressure-sensitive adhesive layer 12 in the heat-peelable pressure-sensitive adhesive sheet 11 does not thermally expand (a temperature lower than the release start temperature of the heat-expandable pressure-sensitive adhesive layer 12), while in the release and heating section 8, the surface part thereof is set up made at a temperature at which the thermo-expandable pressure-sensitive adhesive layer 12 in the heat-peelable pressure-sensitive adhesive sheet 11 thermally expands (a temperature of the release start temperature of the heat-expandable pressure-sensitive adhesive layer 12 or higher). For that reason, when the surface part of the pre-heating section 7 comes into contact with the heat-peelable pressure-sensitive adhesive sheet 11 (back surface of the base material 13), it is partially heated to a degree that the heat-peelable pressure-sensitive adhesive sheet 11 does not thermally expand.

On the other hand, when the surface of the release and heating section 8 comes into contact with a part of the heat-peelable pressure-sensitive adhesive sheet 11 as heated by the foregoing pre-heating section 7 (back surface of the base material 13), it is partially heated rapidly to a temperature at which the heat-peelable pressure-sensitive adhesive sheet 11 thermally expands; the foaming agent in the heat-expandable layer (the heat-expandable pressure-sensitive adhesive layer in FIG. 2) in this partially heated part expands and/or foams, whereby the heat-expandable layer partially expands and the pressure sensitive adhesive surface corresponding to the subject expanded part is unevenly deformed, to cause a reduction in an adhesive area between the subject pressure sensitive adhesive surface and the adherend 14; and as a result, an adhesive strength between the foregoing unevenly deformed pressure sensitive adhesive surface and the adherend 14 is reduced. Then, by adsorbing the adherend 14 by the adsorption nozzle 9 to separate and release it from the heat-peelable pressure-sensitive adhesive sheet 11, the adherend 14a which is a part of an adherend of the adherends 14 as stuck onto the subject pressure sensitive adhesive surface is released from the heat-peelable pressure-sensitive adhesive sheet 11.

Incidentally, as a fixing section for fixing the heat-peelable pressure-sensitive adhesive sheet 11, the fixing ring 10 is used. Also, each of the pre-heating section 7 and the release and heating section 8 has a shape such that heating can be achieved corresponding to the shape of the adherend to be released. The adsorption nozzle 9 of the pre-heating section 7 or the release and heating section 8 is movable in the horizontal direction and the vertical direction as shown by the arrows.

Furthermore, in FIG. 2, the heat-peelable pressure-sensitive adhesive sheet tape 11 having a construction in which the heat-expandable pressure-sensitive adhesive layer 12 is formed on the base material 13. As the heat-peelable pressure-sensitive adhesive sheet, any thermal release type pressure sensitive adhesive tape having a heat-expandable layer containing a foaming agent is useful. For example, the heat-peelable pressure-sensitive adhesive sheet 1 as shown in FIG. 1 can also be used.

In this way, the apparatus for thermal adherend release of the invention is a device for selectively releasing a part of an adherend of plural adherends as stuck to a heat-peelable pressure-sensitive adhesive sheet provided with a heat-expandable layer containing a foaming agent by partially heating the heat-peelable pressure-sensitive adhesive sheet and at least includes a pre-heating section (first heating section) for previously heating the sticking site of the adherend to be released at a temperature at which the heat-expandable layer of the heat-peelable pressure-sensitive adhesive sheet does not expand and a release and heating section (second heating section) for, after previously heating by the first heating section, heating the sticking site of the adherend in the heat-peelable pressure-sensitive adhesive sheet at a temperature at which the heat-expandable layer expands, thereby selectively releasing the adherend.

It is important that for the heating section, for example, such pre-heating section and release and heating section (the "pre-heating section" and the "release and heating section" will be sometimes generically named as "heating section"), a heating system capable of thoroughly heating the heat-peelable pressure-sensitive adhesive sheet is utilized. Concretely, known heating systems such as a heating system by en electric heater, a dielectric heating system, a magnetic heating system, and a heating system by an electromagnetic wave such as infrared rays (for example, near infrared rays, mid infrared rays, and far infrared rays) can be employed. Incidentally, the heating of the heat-peelable pressure-sensitive adhesive sheet by a heating section may be heating by any of direct and indirect methods.

Furthermore, a material of the surface part of the heating section (the pre-heating section and the release and heating section) can be properly chosen depending upon the heating system. For example, in the case of utilizing, as the heating system, a heating system by an electric heater, it is preferable that the surface part of the heating section is constructed of a material having high thermal conductivity. For example, it may be constructed of a combination of a metal material and a thermal insulating material (for example, asbestos). Also, for the purpose of enhancing adhesion between the heating section and the adherend, an elastic material such as rubber may be combined. Concretely, when the surface part of the heating section is constructed of a combination of an elastic material (thermally conductive elastic material) such as rubber, a metal material and a thermal insulating material, it is possible to expand the heat-expandable layer of the heat-peelable pressure-sensitive adhesive sheet more rapidly, thereby separating the adherend more rapidly.

The shape and size of the heating section (the pre-heating section and the release and heating section) can be properly designed depending upon the shape and size of the adherend to be released. By using a heating section corresponding to the shape of the adherend to be released, only a desired site can be efficiently heated. For example, when the site to which the adherend sticks is heated by using the pre-heating section corresponding to the shape of the adherend to be released, in the heat-peelable pressure-sensitive adhesive sheet, the heated part is heated to a prescribed temperature. Thereafter, when the foregoing heated part is heated by using the release and heating section corresponding to the shape of the adherend to be released, the heat-peelable pressure-sensitive adhesive sheet expands from the state before heating (un-expanded part) to the state after heating (expanded part), whereby only a part of an adherend of plural adherends loses an adhesive strength, thereby selectively releasing the adherend to be released. Thus, the released adherend can be picked up by, for example, an adsorption nozzle.

Incidentally, the heating time of the heating section (the pre-heating section and the release and heating section) can be properly set up depending upon the type of the heat-peelable pressure-sensitive adhesive sheet, the type of the foaming agent, the nature of the adherend, the heating system, and the like as described previously and cannot be unequivocally defined. However, when the heating time is too long, even parts which are not desired to be heated may possibly be heated by thermal conduction of the heated heat-peelable pressure-sensitive adhesive sheet and the adherend, or even parts which are not desired to be released may possibly be released. Accordingly, attention should be paid.

The heating section (the pre-heating section and the release and heating section) can be disposed in at least one side of the adherend-sticking side of the heat-peelable pressure-sensitive adhesive sheet and the opposite side thereto (adherend-non-sticking side). In consequence, heating may be carried out by the pre-heating treatment or release and heating method from either one side of the adherend-sticking side and the adherend-non-sticking side of the heat-peelable pressure-sensitive adhesive sheet, and heating may be carried out by the pre-heating treatment or release and heating method from the both sides of the adherend-sticking side and the adherend-non-sticking side of the heat-peelable pressure-sensitive adhesive sheet. Incidentally, in the case where heating is carried out by the pre-heating treatment or release and heating treatment from the both sides of the adherend-sticking side and the adherend-non-sticking side of the heat-peelable pressure-sensitive adhesive sheet, the desired site of the heat-peelable pressure-sensitive adhesive sheet may be heated simultaneously or individually from the both sides of the adherend-sticking side and the adherend-non-sticking side.

Furthermore, the pre-heating section and the release and heating section may be disposed in the same side or in a different side of the adherend-sticking side of the heat-peelable pressure-sensitive adhesive sheet and the opposite side thereto (adherend-non-sticking side). The number of the pre-heating section or the release and heating section to be provided is not particularly limited. Also, the number of the pre-heating section and the number of the release and heating section may be equal to or different from each other. For example, the number of the pre-heating section may be 2, while the number of the release and heating section may be 1.

Incidentally, in the case of providing a plural number of each of the pre-heating section and the release and heating section, for example, two or more pre-heating sections may be disposed in the same side of the adherend-sticking side of the heat-peelable pressure-sensitive adhesive sheet and the opposite side thereto (adherend-non-sticking side) or may be properly divided and disposed in the adherend-sticking side and the adherend-non-sticking side. Also, likewise the case of the foregoing pre-heating section, with respect to two or more release and heating sections, all the sections may be disposed in the same side of the adherend-sticking side of the heat-peelable pressure-sensitive adhesive sheet and the opposite side thereto (adherend-non-sticking side), or the sections may be properly divided and disposed in the adherend-sticking side and the adherend-non-sticking side.

It is preferable that such a heating section (the pre-heating section and the release and heating section) is movable in the horizontal direction and/or the vertical direction. When the heating section can be three-dimensionally moved, it is possible to selectively heat a desired site of the heat-peelable pressure-sensitive adhesive sheet with efficiency.

Furthermore, in the foregoing thermal release device of an adherend, a fixing section for fixing the heat-peelable pressure-sensitive adhesive sheet is provided. This fixing section can be arbitrarily provided. It is important that the fixing section utilizes a fixing system capable of thoroughly achieving fixation without causing displacement or the like between the adherend and the heat-peelable pressure-sensitive adhesive sheet at the time of processing or release of the adherend. Concretely, the fixing system in the fixing section can be properly chosen depending upon the type of the adherend or the like, and examples thereof include known fixing systems such as a fixing system by a ring frame (fixing ring), a fixing system by a pedestal, and a fixing system by vacuum deposition. Incidentally, likewise the heating section, the fixing section may also be movable in the horizontal direction and/or the vertical direction.

Moreover, in the foregoing the apparatus for thermal adherend release, in order that a desired adherend can be released by partially heating the heat-peelable pressure-sensitive adhesive sheet, for the purpose of reducing an adhesive strength and then separating and recovering the adherend as stuck to the subject heat-peelable pressure-sensitive adhesive sheet from the heat-peelable pressure-sensitive adhesive sheet, an adsorption nozzle is provided as a separation and recovery section of an adherend. Such a separation and recovery section of an adherend such as an adsorption nozzle can be arbitrarily provided. The separation and recovery section of an adherend is not particularly limited so far as it can separate and recover the adherend from the heat-peelable pressure-sensitive adhesive sheet. However, a suction section of a system for separating and recovering an adherend by suction is suitable, and especially, an adsorption nozzle can be suitably used. The adsorption nozzle is not particularly limited, and known adsorption nozzles can be properly chosen and used. As a matter of course, the adsorption nozzle can separate and recover an adherend from the heat-peelable pressure-sensitive adhesive sheet by adsorbing the adherend onto a tip of the nozzle by suction. Likewise the heating section, it is preferable that the separation and recovery section of an adherend is movable in the horizontal direction and/or the vertical direction (in particular, three-dimensionally).

In the apparatus for thermal adherend release of the invention, a cutting processing section for cutting an adherend as stuck to the heat-peelable pressure-sensitive adhesive sheet into plural cut pieces may be provided. That is, the thermal release device of an adherend may include a cutting processing section for subjecting an adherend as stuck to a heat-peelable pressure-sensitive adhesive sheet provided with a heat-expandable layer containing a foaming agent to cutting processing into plural cut pieces; a pre-heating section (first heating section) for previously heating a sticking site of the adherend to be released at a temperature at which the heat-expandable layer of the heat-peelable pressure-sensitive adhesive sheet does not expand; and a release and heating section (second heating section) for, after previously heating by the first heating section, heating the sticking site of the adherend in the heat-peelable pressure-sensitive adhesive sheet at a temperature at which the heat-expandable layer expands, to thereby selectively release the adherend.

Such a cutting processing section can be arbitrarily provided. The cutting processing section is not particularly limited so far as it can cut the adherend as stuck to the heat-peelable pressure-sensitive adhesive sheet into plural cut pieces and can be properly chosen depending upon the type of the adherend and the size of the cut piece. In the case where the adherend is a silicon wafer as described below, a dicing processing section for performing dicing processing is suitably used as the cutting processing section.

According to the apparatus for thermal adherend release of the invention, after subjecting the adherend as stuck to the heat-peelable pressure-sensitive adhesive sheet to a cutting processing treatment by the cutting processing section, the heat-peelable pressure-sensitive adhesive sheet may be subjected to the cutting processing treatment, the pre-heating treatment, the release and heating treatment, and optionally, the separation and recovery treatment by procedures such that with respect to the sticking site of a desired part of a cut piece of plural cut pieces having been subjected to this cutting processing treatment, the pre-heating treatment by the pre-heating section is performed, the release and heating treatment by the release and heating section is then performed, and optionally, the separation and recovery treatment by the separation and recovery section of adherend is further performed; and thereafter, with respect to other adherends, the same operations are repeated.

In particular, in the invention, in releasing the cut piece from the heat-peelable pressure-sensitive adhesive sheet, the heat-peelable pressure-sensitive adhesive sheet is partially heated at prescribed temperatures, respectively by utilizing the foregoing pre-heating section and the foregoing release and heating section. Accordingly, by partially performing the cutting processing by the cutting processing section, a partial cutting processing treatment, a partial pre-heating treatment, and a partial release and heating treatment can be performed in parallel. Concretely, first of all, a desired adherend of adherends as stuck to a heat-peelable pressure-sensitive adhesive sheet is cut into plural cut pieces by the cutting processing section, and thereafter, a next desired adherend is cut into plural cut pieces by the cutting processing section. In this case, in parallel to this cutting processing, the sticking site of a part of a cut piece of the previously cut plural cut pieces is subjected to a pre-heating treatment by the pre-heating section. Thereafter, in parallel to the cutting processing treatment for cutting the other desired adherend into plural cut pieces by the cutting processing section and the pre-heating treatment for heating the sticking site of a part of a cut piece of the previously cut plural cut pieces by the pre-heating section, the cut piece which has been previously subjected to a pre-heating treatment is selectively released.

Accordingly, it is possible to perform a release and heating treatment for performing partial heating by the release and heating section. Thus, the cutting processing treatment by the cutting processing section, the pre-heating treatment of the cut piece by the pre-heating section, and the release and heating treatment of the cut piece having been subjected to the pre-heating treatment by the release and heating section can be performed extremely efficiently, and the productivity can be largely enhanced. As a matter of course, after the heat release treatment, a separation and recovery treatment of the cut piece is performed by the separation and recovery section of an adherend. By partially performing the separation and recovery treatment of the cut piece by this separation and recovery section of an adherend (separation and recovery section of a cut piece), this treatment can be performed in parallel to the heating treatment. For that reason, for example, it is possible to perform the cutting processing treatment, the pre-heating treatment, the release and heating treatment, and the separation and recovery treatment in parallel to each other.

Incidentally, in this way, in the case of performing the cutting processing treatment, the pre-heating treatment, the release and heating treatment, and the separation and recovery treatment in parallel to each other, it is important that the cutting processing section for performing the cutting processing, the pre-heating section for performing the heating at a temperature at which the heat-expandable layer does not expand, the release and heating section for performing the heating at a temperature at which the heat-expandable layer expands, and the separation and recovery section of a cut piece for performing the separation and recovery (corresponding to the separation and recovery section of an adherend in FIG. 2) are each movable in the horizontal direction and/or the vertical direction (in particular, three-dimensionally).

In this way, according to the apparatus for thermal adherend release of the invention, it is possible to perform a cutting processing treatment, a pre-heating treatment, a release and heating treatment, and optionally, a separation and recovery treatment by a single device. On this occasion, in the thermal release device of an adherend, the cutting processing section, the pre-heating section, the release and heating section, and optionally, the separation and recovery section of an adherend (separation and recovery section of a cut piece) may be set up in separate places or in a movable manner, or may be set up in the same place. Incidentally, in the case where the cutting processing section, the pre-heating section, the release and heating section, and the separation and recovery section of an adherend (separation and recovery section of a cut piece) are set up in separate places or in a movable manner, it is possible to perform the cutting processing treatment, the pre-heating treatment, the release and heating treatment, and the separation and recovery treatment in parallel to each other.

On the other hand, in the case where these sections are set up in the same place, it is possible to repeatedly perform the cutting processing treatment, the pre-heating treatment, the release and heating treatment, and the separation and recovery treatment in this order.

(Adherend)

In order to apply a variety of processings, the adherend is not particularly limited so far as it is stuck to a heat-peelable pressure-sensitive adhesive sheet. Examples of the adherend include electronic series parts such as semiconductor wafers (for example, silicon wafers) and semiconductor chips, and electronic parts and circuit boards using an electronic series part (for example, electronic parts composed of a silicon wafer as a substrate).

EXAMPLES

The invention will be described below in detail with reference to the following Examples, but it should not be construed that the invention is limited thereto.

Example 1

In a thermal release type pressure sensitive adhesive tape (fixed by a fixing ring) constructed of a polyester base material (100 μm in thickness) and a heat-expandable pressure-sensitive adhesive layer, whose adhesive strength is lowered at 90° C. (the release start temperature is 90° C.), as formed on one surface of the polyester based material, a silicon wafer (150 μm in thickness) having a diameter of 6 inches was stuck on the surface of the heat-expandable pressure-sensitive adhesive layer without incorporation with air bubbles. Thereafter, the foregoing silicon wafer was diced into a size of 3 mm in square.

Also, a pre-heating section and a release and heating section in which a stainless steel (SUS 304) plate having a size of 3 mm in square and a thickness of 2 mm and a thermally conductive rubber sheet (3 mm in square and 1 mm in thickness) were provided in a tip of an electric heater were respectively prepared as the pre-heating section and the release and heating section. Then, heating was performed by the electric heater such that the temperature of the rubber sheet part (leading-tip part) in the pre-heating section became 80° C. Also, heating was performed by the electric heater such that the temperature of the rubber sheet part (leading-tip part) in the release and heating section became 150° C.

Next, a sticking site to which a desired cut piece of the silicon wafer to be released of plural cut pieces of the silicon wafer as formed by dicing was heated by pressing the pre-heating section in which the rubber sheet part thereof was heated at 80° C. from the back surface side of the sheet; and the release and heating section in which the rubber sheet part thereof was heated at 150° C. was then pressed from the back surface side of the sheet, thereby thermally expanding the heat-expandable pressure-sensitive adhesive layer. After the adhesive strength of the heat-expandable pressure-sensitive adhesive layer had been substantially lost, by adsorbing the cut piece of the silicon wafer by an adsorption nozzle by means of suction, the cut piece of the silicon wafer was released from the thermal release type pressure sensitive adhesive tape, thereby achieving separation and recovery. In this way, when the cut piece of the silicon wafer was adsorbed by the adsorption nozzle and released, a time required for releasing one cut piece of the silicon wafer (time required for release in average) was 1.7 seconds as shown in Table 1.

Incidentally, in the pre-heating section, an operation in which after canceling pressing to the sticking site to which the desired cut piece of the silicon wafer to be released stuck, the pre-heating section immediately moved to a next desired cut piece of the silicon wafer to be released and pressed from the back surface side of the sheet to perform heating was carried out successively. Also, in the release and heating section, an operation in which at the same time when the adhesive strength of the heat-expandable pressure-sensitive adhesive layer had been substantially lost, the release and heating section moved to the sticking site to which the cut piece of the silicon wafer as heated by the pre-heating section and pressed it from the back surface side of the sheet to perform heating was carried out successively. In this way, the pre-heating section and the release and heating section were successively moved, thereby releasing the cut piece of the silicon wafer successively.

Example 2

A cut piece of a silicon wafer was released in the same manner as in Example 1, except for using a thermal release type pressure sensitive adhesive tape having a heat-expandable pressure-sensitive adhesive layer having a release start temperature of 120° C. as the thermal release type pressure sensitive adhesive tape and employing the conditions such that the temperature of the rubber sheet part (leading-tip part) in the pre-heating section was 105° C. and that the temperature of the rubber sheet part (leading-tip part) in the release and heating section was 170° C. On this occasion, when the cut piece of the silicon wafer was adsorbed by the adsorption nozzle and released, a time required for releasing one cut piece of the silicon wafer (time required for release in average) was 1.5 seconds as shown in Table 1.

Comparative Example 1

A cut piece of a silicon wafer was released in the same manner as in Example 1, except that the pre-heating section was not used. On this occasion, when the cut piece of the silicon wafer was adsorbed by the adsorption nozzle and released, a time required for releasing one cut piece of the silicon wafer (time required for release in average) was 3.5 seconds as shown in Table 1.

Comparative Example 2

A cut piece of a silicon wafer was released in the same manner as in Example 2, except that the pre-heating section was not used. On this occasion, when the cut piece of the silicon wafer was adsorbed by the adsorption nozzle and released, a time required for releasing one cut piece of the silicon wafer (time required for release in average) was 3.1 seconds as shown in Table 1.

TABLE 1

|  | Example | | Comparative Example | |
| --- | --- | --- | --- | --- |
|  | 1 | 2 | 1 | 2 |
| Time required for release (sec) | 1.7 | 1.5 | 3.5 | 3.1 |

As is apparent from Table 1, in thermally releasing the adherend such as a cut piece of a silicon wafer from the thermal release type pressure sensitive adhesive tape, by previously heating the sticking site of the adherend at a temperature at which the heat-expandable layer does not expand (a temperature lower than the release start temperature of the heat-peelable pressure-sensitive adhesive sheet), only the desired adherend could be selectively released without causing falling off of other adherends; and by expanding the heat-expandable layer or the foaming agent (for example, a heat-expandable microsphere), the time required for vanishing the adhesive strength of the thermal release type pressure sensitive adhesive tape (in particular, the heat-expandable pressure-sensitive adhesive layer) could be effectively shortened. In consequence, according to the method of the Examples, it is possible to release a part of an adherend of plural adherends as stuck to the thermal release type pressure sensitive adhesive tape selectively and more rapidly.

While the invention has been described in detail and with reference to specific embodiments thereof, it will be apparent to one skilled in the art that various changes and modifications can be made therein without departing from the spirit and scope thereof.

The present application is based on Japanese Patent Application 2004-356463, filed on Dec. 9, 2004, and the entire disclosure thereof is incorporated herein by reference in its entirety.

What is claimed is:

1. A method of thermal adherend release, wherein a part of adherends adherent to a heat-peelable pressure-sensitive adhesive sheet having a heat-expandable layer containing a foaming agent are selectively released from the pressure-sensitive adhesive sheet by partly heating the heat-peelable pressure-sensitive adhesive sheet,
wherein the method comprises a step of previously heating a sticking site of an adherend to be released at a temperature at which the heat-expandable layer of the heat-peelable pressure-sensitive adhesive sheet does not expand using a pre-heater and a subsequent step of heating the sticking site of the adherend in the heat-peelable pressure-sensitive adhesive sheet at a temperature at which the heat-expandable layer expands to thereby selectively releasing the adherend using a heater separate from the pre-heater,
wherein the sticking site of the adherend to be released in the heat-peelable pressure-sensitive adhesive sheet is previously heated at a temperature at which the heat-expandable layer of the heat-peelable pressure-sensitive adhesive sheet does not expand by a heating measure capable of not only partially heating the heat-peelable pressure-sensitive adhesive sheet but also heating it corresponding to the shape of the adherend to be released.

2. The method of thermal adherend release according to claim 1, wherein the temperature at which the sticking site of the adherend to be released is previously heated is 30° C. lower than the release start temperature of the heat-peelable pressure-sensitive adhesive sheet or higher but lower than the release start temperature of the heat-peelable pressure-sensitive adhesive sheet.

3. The method of thermal adherend release according to claim 1 or 2, wherein the foaming agent is a heat-expandable microsphere.

4. The method of thermal adherend release according to claim 1 or 2, wherein the sticking site of the adherend to be released in the heat-peelable pressure-sensitive adhesive sheet is heated at a temperature at which the heat-expandable layer expands by a heating measure capable of not only partially heating the heat-peelable pressure-sensitive adhesive sheet but also heating it corresponding to the shape of the adherend to be released to thereby selectively release the adherend.

5. The method of thermal adherend release according to claim 1 or 2, wherein the sticking site of the adherend to be released is previously heated from at lease one side of the sticking side of the adherend of the heat-peelable pressure-sensitive adhesive sheet and an opposite side thereto at a temperature at which the heat-expandable layer does not expand.

6. The thermal release method of an adherend according to claim 1 or 2, wherein the sticking site of the adherend to be released is previously heated at a temperature at which the heat-expandable layer does not expand, and the sticking site of the adherend to be released of the heat-peelable pressure-sensitive adhesive sheet is then heated from at lease one side of the sticking side of the adherend of the heat-peelable pressure-sensitive adhesive sheet and an opposite side thereto at a temperature at which the heat-expandable layer expands.

7. A method of thermal adherend release, wherein a part of adherends adherent to a heat-peelable pressure-sensitive adhesive sheet having a heat-expandable layer containing a foaming agent are selectively released from the pressure-sensitive adhesive sheet, wherein the method comprises:
a step for subjecting the adherend adherent to the heat-peelable pressure-sensitive adhesive sheet to cutting processing into plural cut pieces;
a step for previously heating a sticking site of the cut piece to be released of the plural cut pieces at a temperature at which the heat-expandable layer of the heat-peelable pressure-sensitive adhesive sheet does not expand by a heating measure capable of not only partially heating the heat-peelable pressure-sensitive adhesive sheet but also heating it corresponding to the shape of the adherend to be released using a preheater; and
a step for heating the sticking site of the cut piece to be released at a temperature at which the heat-expandable layer expands, to thereby selectively release the cut piece using a heater separate from the pre-heater.

8. An apparatus for thermal adherend release, wherein a part of adherends adherent to a heat-peelable pressure-sensitive adhesive sheet having a heat-expandable layer containing a foaming agent are selectively released from the pressure-sensitive adhesive sheet by partly heating the heat-peelable pressure-sensitive adhesive sheet, wherein the apparatus comprises:

a first heating section which previously heats a sticking site of an adherend to be released at a temperature at which the heat-expandable layer of the heat-peelable pressure-sensitive adhesive sheet does not expand; and a second heating section which, after previously heating by the first heating section, heats the sticking site of the adherend in the heat-peelable pressure-sensitive adhesive sheet at a temperature at which the heat-expandable layer expands, to thereby selectively release the adherend, wherein each of the first heating section and the second heating section has a shape such that heating can be performed corresponding to the shape of the adherend to be released.

9. The apparatus for thermal adherend release according to claim 8, wherein each of the first heating section and the second heating section is provided in at least one side of the sticking side of the adherend of the heat-peelable pressure-sensitive adhesive sheet and an opposite side thereto.

10. The apparatus for thermal adherend release according to claim 8, wherein each of the first heating section and the second heating section is movable in the horizontal direction and/or the vertical direction.

11. The apparatus for thermal adherend release according to claim 8, which comprises:

a cutting processing section for subjecting an adherend as stuck to a heat-peelable pressure-sensitive adhesive sheet provided with a heat-expandable layer containing a foaming agent into plural cutting pieces;

a first heating section for previously heating the sticking site of a cut piece to be released of the plural cut pieces at a temperature at which the thermo-expandable layer of the heat-peelable pressure-sensitive adhesive sheet does not expand; and a second heating section for heating the sticking site of the cut piece to be released at a temperature at which the heat-expandable layer expands, to thereby selectively release the cut piece.

* * * * *